United States Patent
Furumiya et al.

(10) Patent No.: US 7,973,383 B2
(45) Date of Patent: Jul. 5, 2011

(54) SEMICONDUCTOR INTEGRATED CIRCUIT DEVICE HAVING A DECOUPLING CAPACITOR

(75) Inventors: Masayuki Furumiya, Kanagawa (JP); Hiroaki Ohkubo, Kanagawa (JP); Yasutaka Nakashiba, Kanagawa (JP)

(73) Assignee: Renesas Electronics Corporation (JP)

( * ) Notice: Subject to any disclaimer, the term of this patent is extended or adjusted under 35 U.S.C. 154(b) by 20 days.

(21) Appl. No.: 11/860,050

(22) Filed: Sep. 24, 2007

(65) Prior Publication Data

US 2008/0265372 A1    Oct. 30, 2008

Related U.S. Application Data

(62) Division of application No. 10/688,000, filed on Oct. 17, 2003, now Pat. No. 7,288,826.

(30) Foreign Application Priority Data

Oct. 24, 2002 (JP) .................. 2002-310187

(51) Int. Cl.
*H01L 29/00* (2006.01)
*H01L 21/8238* (2006.01)

(52) U.S. Cl. .................. 257/516; 438/210; 438/329

(58) Field of Classification Search .................. 257/516, 257/528, 532, 312, 313, 314, E21.004–E21.007; 438/210, 329
See application file for complete search history.

(56) References Cited

U.S. PATENT DOCUMENTS

| 5,519,243 | A  | * | 5/1996  | Kikuda et al. ............... 257/371 |
| 6,166,415 | A  | * | 12/2000 | Sakemi et al. .............. 257/372 |
| 6,259,136 | B1 |   | 7/2001  | Kawaguchi et al. ......... 257/336 |
| 6,337,824 | B1 |   | 1/2002  | Kono et al. ................. 365/207 |
| 6,541,840 | B1 | * | 4/2003  | Terayama et al. ........... 257/516 |
| 6,768,171 | B2 |   | 7/2004  | Disney ........................ 257/342 |

FOREIGN PATENT DOCUMENTS

| JP | 53-068181   | 6/1978  |
| JP | 61-137355   | 6/1986  |
| JP | 62-224042   | 10/1987 |
| JP | 03-096268   | 4/1991  |
| JP | 05-041479   | 2/1993  |
| JP | 05-175519   | 7/1993  |
| JP | 10/012825   | 1/1998  |
| JP | 2001-345428 | 12/2001 |
| JP | 2002-124636 | 4/2002  |

* cited by examiner

*Primary Examiner* — Calvin Lee
(74) *Attorney, Agent, or Firm* — Hayes Soloway P.C.

(57) ABSTRACT

The bottom side of an N type silicon substrate is connected to a power supply terminal, a second P type epitaxial layer is formed on all sides of the N type silicon substrate, and a device forming portion is provided on the second P type epitaxial layer. A first P type epitaxial layer and an interlayer insulating film are provided on the device forming portion and an N well and a P well are formed on the top surface of the first P type epitaxial layer. The second P type epitaxial layer is connected to a ground terminal via the first P type epitaxial layer, the P well, a $p^+$ diffusion region, a via and a wire. Accordingly, a pn junction is formed at the interface between the second P type epitaxial layer and the N type silicon substrate.

5 Claims, 6 Drawing Sheets

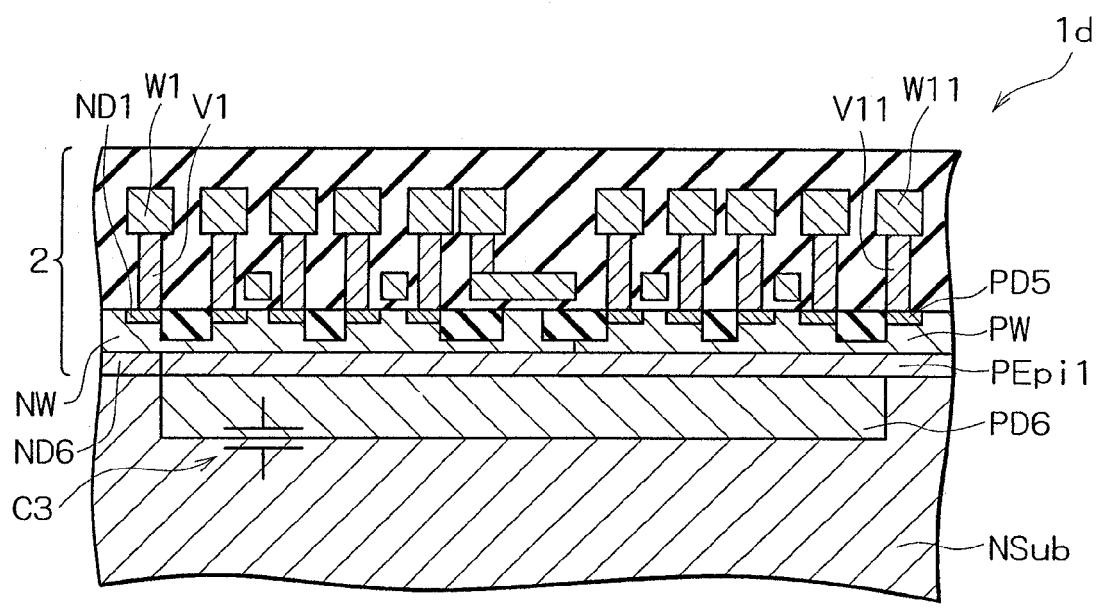
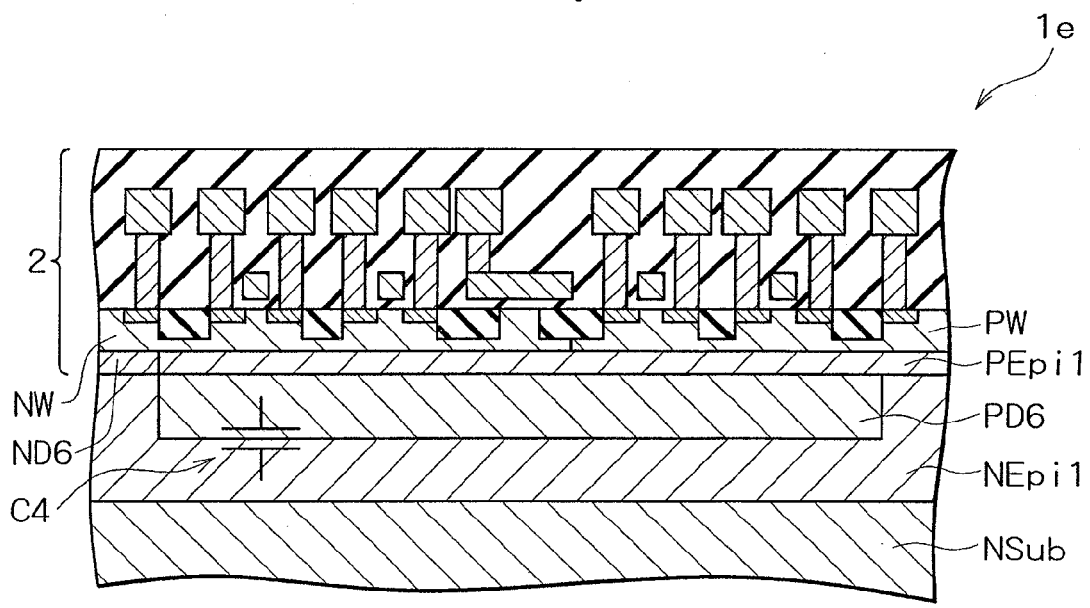

SEMICONDUCTOR INTEGRATED CIRCUIT DEVICE HAVING A DECOUPLING CAPACITOR

This application is a divisional of U.S. patent application Ser. No. 10/688,000 entitled, "Semiconductor integrated circuit device," filed on Oct. 17, 2003 and issued as U.S. Pat. No. 7,288,826 on Oct. 30, 2007, which is entirely incorporated herein by reference.

BACKGROUND OF THE INVENTION

1. Field of the Invention

The present invention relates to a semiconductor integrated circuit device having a decoupling capacitor, and, more particularly, to a semiconductor integrated circuit device with an improved device integration density.

2. Description of the Related Art

As operational frequencies of semiconductor integrated circuit devices have become increasingly higher, there is a tendency for the wiring area allocated to the power supply wire and ground wire to also become larger. Thus, when a semiconductor integrated circuit device operates at high frequency, a variation in power supply voltage, such as temporary current spike, is likely to occur.

As a conventional scheme to suppress this variation in power supply voltage, there is known a technique of connecting a decoupling capacitor in parallel to the power supply. This connection can reduce power supply noise and suppress a variation in power supply voltage, which leads to 1) prevention of the malfunction of a semiconductor integrated circuit originated from power supply noise and, 2) a variation in power supply voltage. To achieve the above object, the size of the decoupling capacitor connected to the power supply should be set to several tens of nF with respect to a single chip or package. In the conventional semiconductor integrated circuit device, an exclusive layout area for a decoupling capacitor is provided at each side of space between the core portion or the device forming region and the I/O portion, and the decoupling capacitor is formed by MOS (Metal Oxide Semiconductor).

However, in a conventional semiconductor integrated circuit device, the need for the exclusive layout area for a decoupling capacitor increases the device area and lowers the device integration density.

An example of a solution to this problem, Japanese Patent Laid-Open No. 12825/1998, discloses a technique of forming a polycrystalline silicon layer on the device side of a semiconductor substrate and forming a decoupling capacitor between the polycrystalline silicon layer and the top surface of the semiconductor substrate. The technique this patent describes eliminates the need for the exclusive layout area for a decoupling capacitor.

Due to the decoupling capacitor formation on the device side of a device forming region according to the conventional technique, a problem arises in that the area of the device forming region increases.

Japanese Patent Laid-Open No. 2002-124636 discloses a technique of providing a multilayer wiring structure on a semiconductor element and forming 1) an electrode, 2) a dielectric film and 3) an electrode on the multilayer wiring structure in the named order; thereby forming a decoupling capacitor. Japanese Patent Laid-Open No. 2002-124636 describes that this technique allows a large-capacitance decoupling capacitor to be provided in a semiconductor device.

However, the above conventional technique has a problem. Because a decoupling capacitor is provided on the multilayer wiring structure according to the technique described in Japanese Patent Laid-Open No. 2002-124636, pad electrodes cannot be provided in the region on the multilayer wiring structure where the decoupling capacitor is provided. This restricts the layout of the semiconductor integrated circuit device and enlarges it as a consequence. Also, providing a decoupling capacitor on the multilayer wiring structure requires at least the step of forming a lower electrode layer, the step of forming a dielectric layer and the step of forming an upper electrode layer, which complicates the fabrication process for the semiconductor integrated circuit device and increases the fabrication cost.

SUMMARY OF THE INVENTION

Accordingly, it is an object of the invention to provide a semiconductor integrated circuit device having a decoupling capacitor, which does not require an exclusive layout area for the decoupling capacitor and is easy to fabricate.

A semiconductor integrated circuit device according to the invention, comprises: 1) a first conductivity type semiconductor substrate connected to a first power supply; 2) a second conductivity type semiconductor layer provided on the first conductivity type semiconductor substrate or at a top surface of the first conductivity type semiconductor substrate and connected to a second power supply; and 3) a device forming portion provided on the second conductivity type semiconductor layer; with a decoupling capacitor formed at an interface between the first conductivity type semiconductor substrate and the second conductivity type semiconductor layer.

According to the invention, as the decoupling capacitor connected in parallel to the power supply is formed at the interface between the first conductivity type semiconductor substrate and the second conductivity type semiconductor layer, the power supply noise and a variation in power supply voltage can be suppressed, thus preventing the malfunction of the semiconductor integrated circuit device. The provision of the decoupling capacitor connected in parallel to the power supply at the interface between the first conductivity type semiconductor substrate and the second conductivity type semiconductor layer eliminates an exclusive layout area for the decoupling capacitor and effectively makes the device smaller. Further, the decoupling capacitor can be formed easily by forming the second conductivity type semiconductor layer, so that both the fabrication process does not become complicated and the actual fabrication becomes easier.

The second conductivity type semiconductor layer may be provided on an entire top surface of the first conductivity type semiconductor substrate or on the entire top surface of the first conductivity type semiconductor substrate, and a bottom surface of the first conductivity type semiconductor substrate may be connected to the first power supply. This makes it possible to form a decoupling capacitor on the first conductivity type semiconductor substrate or the entire top surface of the first conductivity type semiconductor substrate, yielding a large-capacitance decoupling capacitor.

At this time, the device forming portion may have a first conductivity type well contacting the second conductivity type semiconductor layer and connected to a third power supply and another decoupling capacitor may be formed at an interface between the first conductivity type well and the second conductivity type semiconductor layer.

The device forming portion may have another second conductivity type semiconductor layer electrically connected to the second conductivity type semiconductor layer, and a first conductivity type well provided on the another second conductivity type semiconductor layer contacted with the another second conductivity type semiconductor layer and connected to a third power supply, and another decoupling capacitor may be formed at an interface between the first conductivity type well and the another second conductivity type semiconductor layer.

This makes it possible to form another decoupling capacitor connected in parallel to the first decoupling capacitor. As a result, the total capacitance of the decoupling capacitors can be increased. The device forming portion may have an active element connected to the third power supply, or the potential of the third power supply may differ from potentials of the first and second power supplies. This makes it possible to independently set the voltage for driving the active element and the voltage for forming the decoupling capacitor and optimally adjusting the voltages.

The second conductivity type semiconductor layer may be locally provided on the first conductivity type semiconductor substrate or at the top surface of the first conductivity type semiconductor substrate. The device forming portion may be formed in the region in the top surface of the first conductivity type semiconductor substrate where the second conductivity type semiconductor layer is not provided. The first conductivity type semiconductor substrate may be connected to the first power supply via the device forming portion. This makes it possible to control the capacitance by adjusting the area of the decoupling capacitor and also makes it unnecessary to connect the bottom side of the first conductivity type semiconductor layer to the first power supply. The mounting therefore becomes easier.

The first conductivity type semiconductor substrate may have a substrate body, and a surface portion having a lower resistivity than that of the substrate body. Accordingly, the decoupling capacitor can be formed between the top layer portion of the first conductivity type semiconductor substrate whose resistivity is lower than that of the substrate body and the second conductivity type semiconductor layer, which increases the capacitance of the decoupling capacitor.

Another semiconductor integrated circuit device according to the invention comprises 1) a first conductivity type semiconductor substrate connected to a first power supply; and 2) a device forming portion provided on the first conductivity type semiconductor substrate and having a second conductivity type well connected to a second power supply, with a decoupling capacitor formed at an interface between the first conductivity type semiconductor substrate and the second conductivity type well.

According to the invention, the decoupling capacitor connected to the power supply is formed at the interface between the first conductivity type semiconductor substrate and the second conductivity type well formed in the device forming portion. Accordingly, power supply noise and a variation in power supply voltage can be suppressed, thus preventing the malfunction of the semiconductor integrated circuit device. This also eliminates the need for an exclusive layout area for the decoupling capacitor which can make the device smaller. Further, the decoupling capacitor can be formed easily by forming the second conductivity type well so that both the fabrication process does not become complicated and the actual fabrication becomes easier.

A further semiconductor integrated circuit device according to the invention comprises a substrate; a first first conductivity type semiconductor layer connected to a first power supply provided at least a part of the substrate; a second conductivity type semiconductor layer provided on the first first conductivity type semiconductor layer and connected to a second power supply; and a device forming portion provided on the second conductivity type semiconductor layer, with a decoupling capacitor formed at an interface between the first first conductivity type semiconductor layer and the second conductivity type semiconductor layer.

According to the invention, a decoupling capacitor connected to the power supply is formed at the interface between the first conductivity type semiconductor substrate and the second conductivity type semiconductor layer. Accordingly, power supply noise and a variation in power supply voltage can be suppressed, thus preventing the malfunction of the semiconductor integrated circuit device and eliminating the need for an exclusive layout area for the decoupling capacitor, which can make the device smaller. Further, as the decoupling capacitor can be formed easily by forming the second conductivity type semiconductor layer, both the fabrication process does not become complicated and the actual fabrication becomes easier.

The first first conductivity type semiconductor layer may be provided selectively on the substrate, the device may also have a second first conductivity type semiconductor layer (provided in that region where the first conductivity type semiconductor layer and the second conductivity type semiconductor layer are not provided) connected to the first conductivity type semiconductor layer and the first power supply, and the first conductivity type semiconductor layer may be connected to the first power supply via the device forming portion and second first conductivity type semiconductor layer. This allows the first conductivity type semiconductor layer to be connected to the first power supply by a simple structure.

It is preferable that the substrate have a resistivity of 100 $\Omega\cdot\text{cm}$ or higher. This can suppress transmission of noise in the substrate and can reliably prevent the malfunction of the semiconductor integrated circuit device.

Furthermore, it is preferable that the device forming portion should have an active element connected to third and fourth power supplies, and the potential of the third power supply should differ from potentials of the first and second power supplies. This makes it possible to independently set the voltage for driving the active element, forming the decoupling capacitor, and optimally adjusting the voltages.

According to the invention, because the decoupling capacitor connected in parallel to the power supply is formed at the interface between the first conductivity type semiconductor substrate and the second conductivity type semiconductor layer, power supply noise and a variation in power supply voltage can be suppressed. This can prevent the malfunction of the semiconductor integrated circuit device. It also eliminates an exclusive layout area for the decoupling capacitor, so the device can be made smaller. Since the capacitor can be formed easily by forming the second conductivity type semiconductor layer, it is possible to form the capacitor easily.

BRIEF DESCRIPTION OF THE DRAWINGS

FIG. 4A shows the concentration distribution of the semiconductor integrated circuit device according to the third embodiment. FIG. 4B shows the concentration distribution of the semiconductor integrated circuit device according to the first embodiment;

FIG. 5 is a cross-sectional view showing a semiconductor integrated circuit device according to a fourth embodiment of the invention;

FIG. 6 is a cross-sectional view showing a semiconductor integrated circuit device according to a fifth embodiment of the invention.

DETAILED DESCRIPTION OF THE PREFERRED EMBODIMENTS

Figure 1:
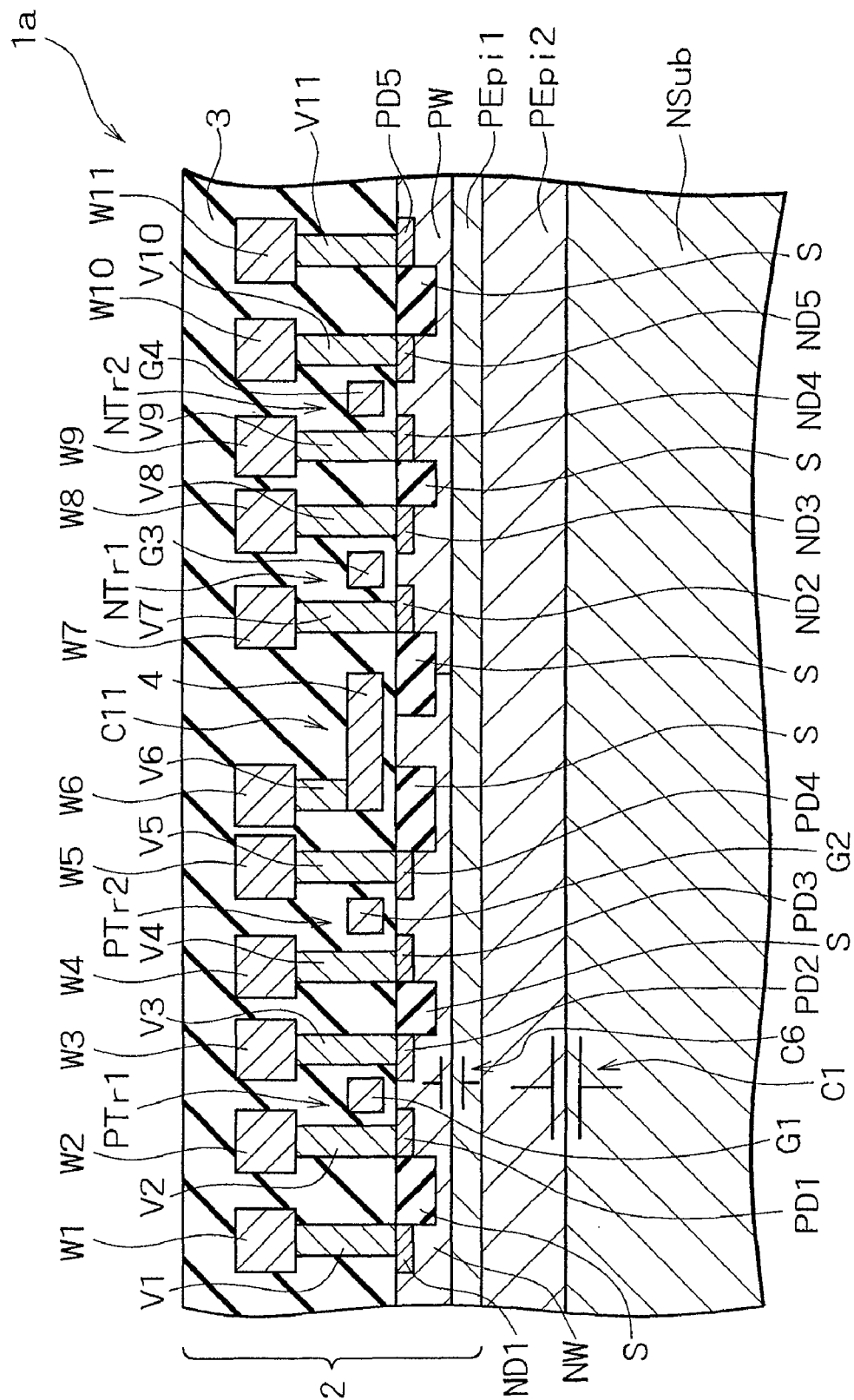
FIG. 1 is a cross-sectional view showing a semiconductor integrated circuit device according to a first embodiment of the invention.

Preferred embodiments of the invention will be described specifically below with reference to the accompanying drawings. FIG. 1 is a cross-sectional view showing a semiconductor integrated circuit device 1a according to the first embodiment. As shown in FIG. 1, an N type silicon substrate, Nsub, is provided in the semiconductor integrated circuit device 1a. The N type silicon substrate Nsub has a resistivity of, for example, 10 Ω·cm and is connected to a power supply terminal (not shown) from its bottom side (not shown). A P type epitaxial layer PEpi2 is formed on the entire surface of the N type silicon substrate Nsub. The P type epitaxial layer PEpi2 has a resistivity of, for example, 0.3 Ω·cm. The N type silicon substrate Nsub has a thickness of, for example, 0.3 to 0.6 μm. The P type epitaxial layer PEpi2 has a thickness of, for example, 1 to 5 μm. As a power supply potential and a ground potential are respectively applied to the N type silicon substrate Nsub and P type epitaxial layer PEpi2, a pn junction is formed at the interface between them and a capacitor C1 is formed at that interface. In other words, the capacitor C1 shown in FIG. 1 equivalently shows a decoupling capacitor which is formed by the pn junction at the interface between the N type silicon substrate Nsub and the P type epitaxial layer PEpi2.

A device forming portion 2 is then provided on the P type epitaxial layer PEpi2. In the device forming portion 2, a P type epitaxial layer PEpi1 and an interlayer insulating film 3 are provided and an N well NW and P well PW are formed on the top surface of the P type epitaxial layer PEpi1. The P type epitaxial layer PEpi1 has a resistivity of, for example, 10 Ω·cm and has a thickness of, for example, 1 to 5 μm. The interlayer insulating film 3 is located on the N well NW and P well PW. As the ground potential and the power supply potential are respectively applied to the P type epitaxial layer PEpi1 and the N well NW, a pn junction is formed at the interface between them and a capacitor C6 is formed at that interface. That is, the capacitor C6 shown in FIG. 1 equivalently shows a decoupling capacitor which is formed by the pn junction at the interface between the P type epitaxial layer PEpi1 and the N well NW. At this time, the capacitors C1 and C6 are connected in parallel to each other.

The top surfaces of the N well NW and the P well PW are separated by device isolation films S and an n+ diffusion region ND1, p channel transistors PTr1 and PTr2 and a capacitor C11 are provided between the device isolation films S on the top surface of the N well NW. Provided on the n+ diffusion region ND1 is a via V1 on which a wire W1 is provided. The n+ diffusion region ND1 is connected to the wire W1 via the via V1. The n+ diffusion region ND1 is connected to a power supply terminal (not shown) via the via V1 and the wire W1. The power supply terminal to which the n+ diffusion region ND1 is connected is different from the power supply terminal to which the N type silicon substrate Nsub is connected.

In the p channel transistor PTr1, p+ diffusion regions PD1 and PD2 which become a source and drain, are formed in the top surface of the N well NW and the area between the p+ diffusion regions PD1 and PD2 on the N well NW is a channel region. A gate electrode G1 is provided above the channel region in the interlayer insulating film 3. That is, a part of the interlayer insulating film 3 is intervened between the N well NW and the gate electrode G1 and serves as a gate insulating film. Vias V2 and V3 are respectively provided on the p+ diffusion region PD1 and p+ diffusion region PD2 and wires W2 and W3 are respectively provided on the vias 2 and 3. The p+ diffusion region PD1 is connected to the wire W2 via the via V2 and the p+ diffusion region PD2 is connected to the wire W3 via the via V3. That is, the p channel transistor PTr1 comprises the N well NW, the p+ diffusion regions PD1 and PD2, the gate electrode G1 and the interlayer insulating film 3.

Likewise, the p channel transistor PTr2 comprises the N well NW, p+ diffusion regions PD3 and PD4, a gate electrode G2 and the interlayer insulating film 3, and the p+ diffusion regions PD3 and PD4 which become a source and drain, and are respectively connected to wires W4 and W5 via respective vias V4 and V5. In the capacitor C11, an electrode layer 4 is provided in the interlayer insulating film 3 and a part of the interlayer insulating film 3 is intervened between the N well NW and the electrode layer 4. Provided on the electrode layer 4 is a via V6 on which a wire W6 is provided. The electrode layer 4 is connected to the wire W6 via the via V6.

Provided between the device isolation films S on the top surface of the P well PW are n channel transistors NTr1 and NTr2, and a p+ diffusion region PD5. Like the p channel transistors PTr1 and PTr2, the n channel transistor NTr1 comprises the P well PW, n+ diffusion regions ND2 and ND3 which become a source and drain, a gate electrode G3 and the interlayer insulating film 3, and the n+ diffusion regions ND2 and ND3 are respectively connected to wires W7 and W8 via respective vias V7 and V8. The n channel transistor NTr2 comprises 1) the P well PW, 2) n+ diffusion regions ND4, and ND5 (which become a source and drain), 3) a gate electrode G4 and 4) the interlayer insulating film 3, and the n+ diffusion regions ND4 and ND5 are respectively connected to wires W9 and W10 via respective vias V9 and V10. Provided on the p+ diffusion region PD5 is a via V11 on which a wire W11 is provided. The p+ diffusion region PD5 is connected to a ground terminal (not shown) via the via V11 and the wire W11 In the device forming portion 2, the gate electrodes G1 to G4 and the electrode layer 4 are provided in the same layer, and the wires W1 to W11 are provided in the same layer.

In the semiconductor integrated circuit device 1a, the P type epitaxial layer PEpi2 is connected to the ground terminal via the P type epitaxial layer PEpi1, the P well PW, the p+ diffusion region PD5, the via Vii and the wire W11. The N type silicon substrate Nsub is connected to the power supply terminal. A pn junction is formed at the interface between the N type silicon substrate Nsub and the P type epitaxial layer PEpi2, thereby forming the capacitor C1 there. Likewise, a pn junction is formed at the interface between the P type epitaxial layer PEpi1 and the N well NW, thereby forming the capacitor C6.

According to the embodiment, the capacitor C1 can be between the N type silicon substrate Nsub and the P type epitaxial layer PEpi2. Further, the capacitor C6 can be formed between the P type epitaxial layer PEpi1 and the N well NW. The capacitors C1 and C6 function as a decoupling capacitor with respect to the power supply. Therefore, in the semiconductor integrated circuit device 1a, a large capacitor can be formed without providing an exclusive layout area for the decoupling capacitor, and power supply noise can thus be suppressed. This can prevent the malfunction of the device originated from power supply noise and can make the semiconductor integrated circuit device 1a smaller.

Because a decoupling capacitor is not provided above the device forming portion 2 in the embodiment, the layout of the device forming portion 2 is not restricted. This can contribute to making the semiconductor integrated circuit device 1a smaller.

Further, the power supply terminal to which the $n^+$ diffusion region ND1 is connected and the power supply terminal to which the N type silicon substrate Nsub is connected are respectively connected to different power supplies in the embodiment. It is possible to make the potential to be applied to the $n^+$ diffusion region ND1 different from the potential to be applied to the N type silicon substrate Nsub. The voltage applied to the $n^+$ diffusion region ND1 drives the p channel transistors PTr1 and PTr2 is set to 1 V. When the voltage applied to the N type silicon substrate Nsub so that a capacitor is formed between this potential and the ground potential is set to 2 V (for instance), the p channel transistors PTr1 and PTr2 can be driven fast and the capacitance of the capacitor C1 can be increased. Both power supply terminals may be connected together into the same power supply (not shown) outside the semiconductor integrated circuit device 1awhich simplifies the circuit structure.

Although an example where the P type epitaxial layer PEpi2 is formed as the second conductivity type semiconductor layer on the N type silicon substrate Nsub as the first conductivity type semiconductor substrate has been illustrated in the foregoing description of the first embodiment, the invention is not limited to this particular structure. For example, after the formation of the device forming portion 2 on the N type silicon substrate Nsub, an impurity can be ion-injected into the surface layer of the N type silicon substrate Nsub with energy high enough to penetrate the device forming portion 2, so that a P type layer having the same impurity concentration as the P type epitaxial layer PEpi2 can be formed. This can create the P type layer which is equivalent to the P type epitaxial layer PEpi2 through a simple process without influencing the device forming portion 2.

Although an example where the N type silicon substrate Nsub is used as the substrate has been illustrated in the foregoing description of the first embodiment, a P type silicon substrate may also be used as the substrate. In this case, an N type epitaxial layer or an N type layer formed by ion injection is formed on the P type silicon substrate, thereby forming a capacitor between the P type silicon substrate and the N type epitaxial layer. Further, a semiconductor substrate other than a silicon substrate may be used as the substrate. The bottom side of the N well NW may contact the P type epitaxial layer PEpi2. Here, the capacitor C6 is formed at the interface between the N well NW and the P type epitaxial layer PEpi2.

Figure 2:
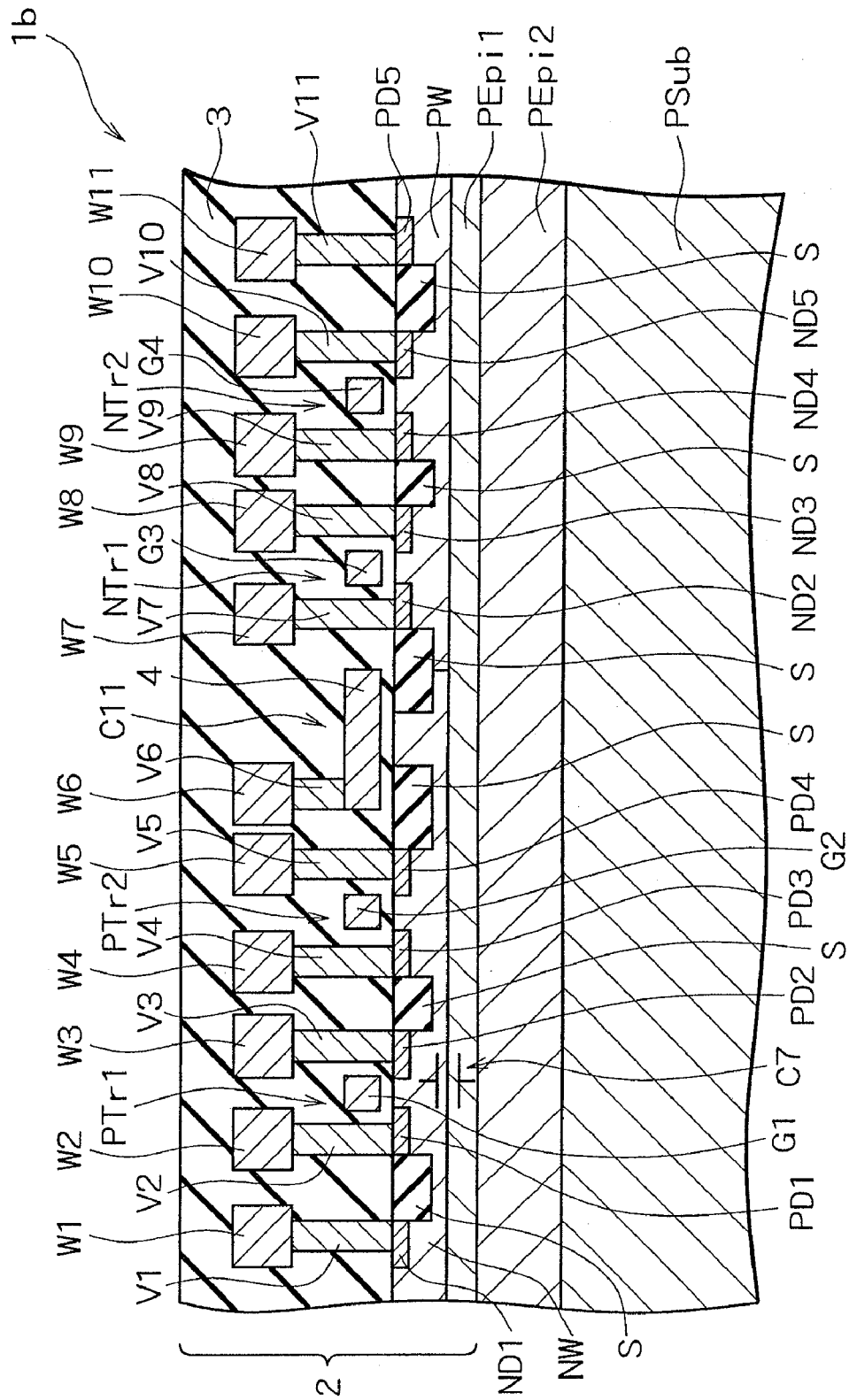
FIG. 2 is a cross-sectional view showing a semiconductor integrated circuit device according to a second embodiment of the invention.

FIG. 2 is a cross-sectional view showing a semiconductor integrated circuit device 1b according to a second embodiment of the invention. As shown in FIG. 2, a P type silicon substrate Psub is provided in the semiconductor integrated circuit device 1b. The P type silicon substrate Psub has a resistivity of, for example, 10 Ω·cm. The P type epitaxial layer PEpi2 is formed on the entire surface of the P type silicon substrate Psub. The P type epitaxial layer PEpi2 has a resistivity of, for example, 0.3 Ω·cm and has a thickness of, for example, 1 to 5 μm. The device forming portion 2 is provided on the P type epitaxial layer PEpi2. The structure of the device forming portion 2 is the same as that of the above-described first embodiment. That is, in the device forming portion 2, the P type epitaxial layer PEpi1 is provided and an N well NW and P well PW are alternately situated on the top surface of the P type epitaxial layer PEpi1. The bottom sides of the N well NW and P well PW are not in contact with the P type epitaxial layer PEpi2.

In the semiconductor integrated circuit device 1b, the P type epitaxial layer PEpi1 is connected to the ground terminal (not shown) via the P well PW, the $p^+$ diffusion region PD5, the via V11 and the wire W11. The N well NW is connected to the power supply terminal (not shown) via the $n^+$ diffusion region ND1, the via V1 and the wire W1. A pn junction is formed at the interface between the P type epitaxial layer PEpi1 and the N well NW, forming a capacitor C7 there.

According to this embodiment, the capacitor C7 can be formed between the P type epitaxial layer PEpi1 and the N well NW. This capacitor C7 serves as a decoupling capacitor connected in parallel to the power supply. The capacitor C7 shown in FIG. 2 equivalently shows a decoupling capacitor which is formed by the pn junction at the interface between the P type epitaxial layer PEpi1 and the N well NW. Because the decoupling capacitor can be formed locally in this embodiment (as compared to the first embodiment, an exclusive capacitor can be laid out near a region where power supply noise is likely to occur in a region which is susceptible to power supply noise. This can effectively suppress the adverse influence of power supply noise on the circuit. The other effects of the embodiment are the same as those of the first embodiment.

Although an example where the bottoms of the N well NW and the P well PW are not in contact with the P type epitaxial layer PEpi2 has been illustrated in the foregoing description of the second embodiment, the bottoms of the N well NW and the P well PW may contact the top surface of the P type epitaxial layer PEpi2. In this case, a capacitor is formed at the interface between the N well NW and the P type epitaxial layer PEpi2. The bottom side of the P type silicon substrate. Psub may be connected to the power supply terminal.

Figure 3:
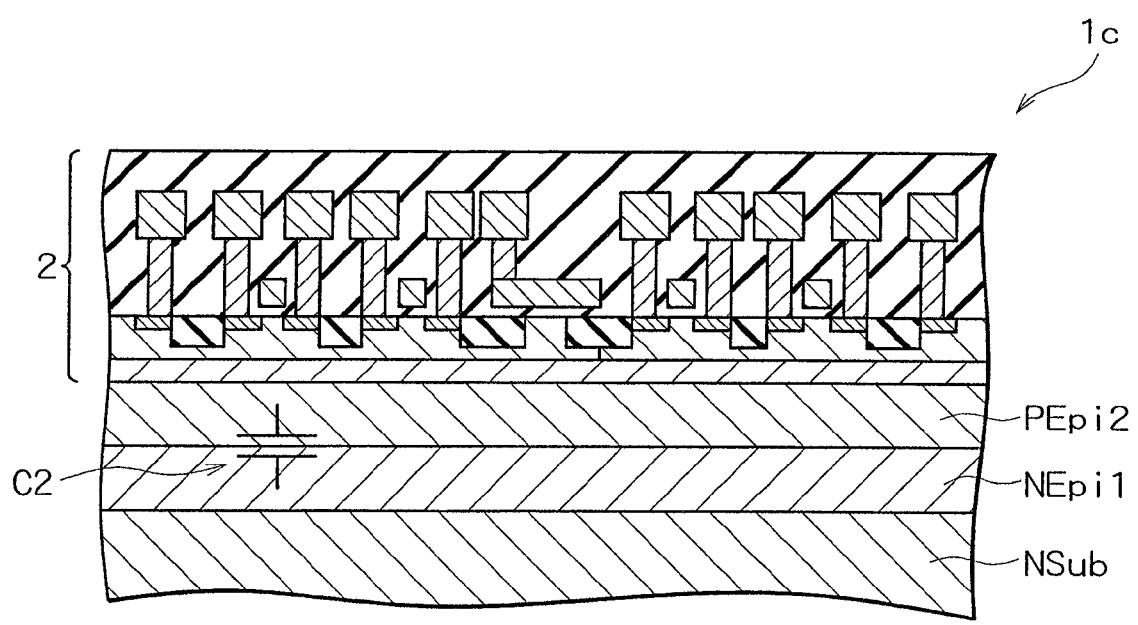
FIG. 3 is a cross-sectional view showing a semiconductor integrated circuit device according to a third embodiment of the invention.
Figure 4A:
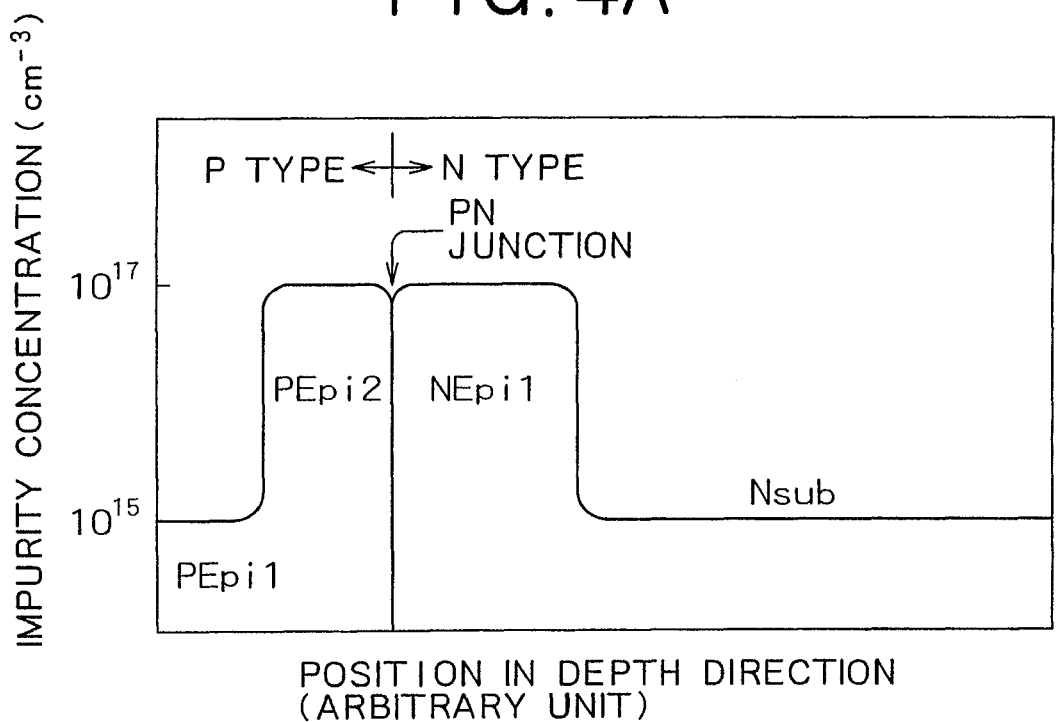
FIGS. 4A and 4B are graphs showing the concentration distribution of the semiconductor integrated circuit device with the depth-directional position in the semiconductor integrated circuit device taken on the horizontal axis and the impurity concentration taken on the vertical axis.
Figure 4B:
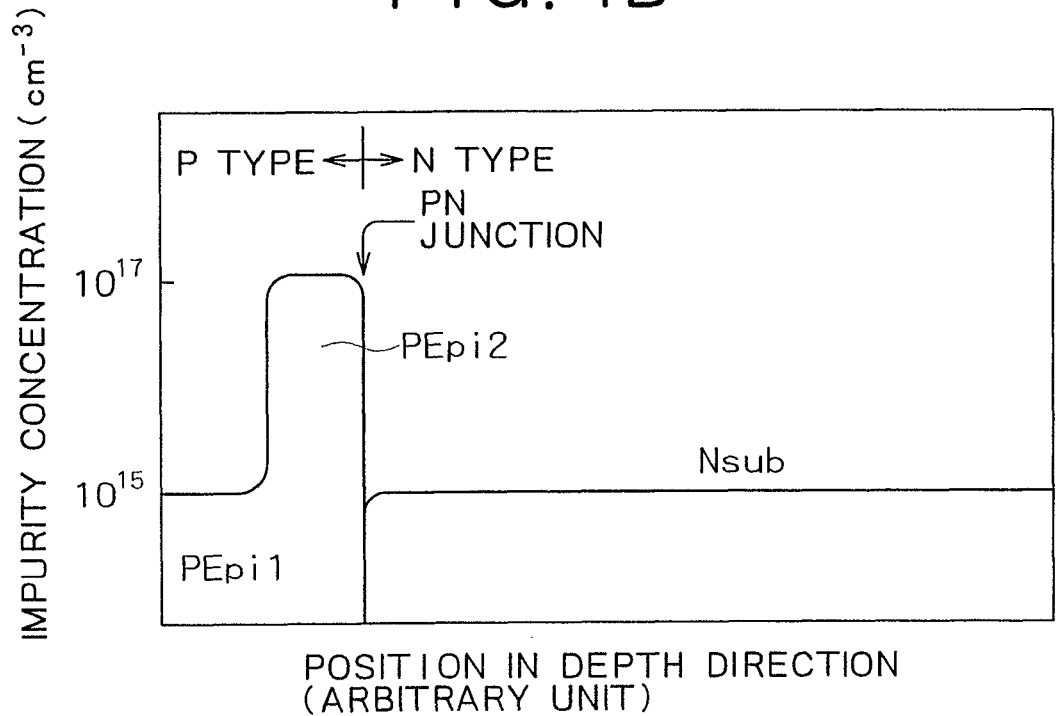

FIG. 3 is a cross-sectional view showing a semiconductor integrated circuit device 1c according to a third embodiment of the invention. FIGS. 4A and 4B are graphs showing the concentration distribution of the semiconductor integrated circuit device with the depth-directional position in the semiconductor integrated circuit device taken on the horizontal axis and the impurity concentration taken on the vertical axis. FIG. 4A shows the concentration distribution of the semiconductor integrated circuit device according to the third embodiment. FIG. 4B shows the concentration distribution of the semiconductor integrated circuit device according to the first embodiment.

As shown in FIG. 3, an N type silicon substrate Nsub is provided in the semiconductor integrated circuit device 1c. The N type silicon substrate Nsub has a resistivity of, for example, 10 Ω·cm and is connected to a power supply terminal (not shown) from its bottom side (not shown). The N type epitaxial layer NEpi1 is formed on the entire surface of the N type silicon substrate Nsub. The N type epitaxial layer PEpi1 has a resistivity of, for example, 0.3 ·cm and has a thickness of, for example, 1 to 5 μm. The P type epitaxial layer PEpi2 is formed on the N type epitaxial layer NEpi1. The P type epitaxial layer PEpi2 has a resistivity of, for example, 0.3

Ω·cm. The device forming portion 2 is then provided on the P type epitaxial layer PEpi2. The structure of the device forming portion 2 is the same as that of the first embodiment.

As shown in FIG. 4A, in the P type epitaxial layer PEpi1 of the semiconductor integrated circuit device 1c of the embodiment, the impurity concentration is, for example, $1\times10^{15}$ cm$^{-3}$ from the top surface of the P type epitaxial layer PEpi1 to the interface between the P type epitaxial layer PEpi1 and the P type epitaxial layer PEpi2. In the P type epitaxial layer PEpi2, the impurity concentration is, for example, $1\times10^{17}$ cm$^{-3}$. Further, in the N type epitaxial layer NEpi1, the impurity concentration is, for example, $1\times10^{17}$ cm$^{-3}$. In the N type silicon substrate Nsub, the impurity concentration is, for example, $1\times10^{15}$ cm$^{-3}$ and is constant in the depth direction. A pn junction with a high impurity concentration is realized at the interface between the P type epitaxial layer PEpi2 and the N type epitaxial layer NEpi1. Accordingly, a capacitor C2 (see FIG. 3) is formed at the interface between the P type epitaxial layer PEpi2 and the N type epitaxial layer NEpi1. The capacitor C2 functions as a decoupling capacitor connected in parallel to the power supply.

Because the N type epitaxial layer NEpi1 is not provided in the semiconductor integrated circuit device 1a according to the first embodiment, as shown in FIG. 4B, a pn junction is formed between the N type silicon substrate Nsub and the P type epitaxial layer PEpi2. Therefore, the impurity concentration at the interface of the pn junction in the first embodiment in FIG. 4B becomes lower than the impurity concentration at the interface of the pn junction in the third embodiment in FIG. 4A.

In this embodiment, a pn junction having a higher impurity concentration than that in the first embodiment can be realized by providing the N type epitaxial layer NEpi1 between the N type silicon substrate NSub and the P type epitaxial layer PEpi2. This makes the capacitance of the capacitor C2 in the semiconductor integrated circuit device 1c of this embodiment greater than the capacitance of the capacitor C1 in the first embodiment. The other structure of the embodiment is the same as the corresponding structure of the first embodiment.

FIG. 5 is a cross-sectional view showing a semiconductor integrated circuit device 1d according to a fourth embodiment of the invention. As shown in FIG. 5, the N type silicon substrate Nsub having a resistivity of, for example, 10 Ω·cm is provided in the semiconductor integrated circuit device 1d. The bottom side of the N type silicon substrate Nsub, unlike that in the first and second embodiments, is not connected to the power supply terminal. A p$^+$ diffusion region PD6 is selectively formed in the top surface of the N type silicon substrate Nsub. The p$^+$ diffusion region PD6 has a resistivity of, for example, 0.01 Ω·cm and has a thickness of, for example, 0.5 to 2 μm.

The device forming portion 2 is provided on the N type silicon substrate Nsub. The structure of the device forming portion 2 is the same as the first embodiment. An n$^+$ diffusion region ND6 in the same layer as the P type epitaxial layer PEpi1 is formed in the region of the top surface of the N type silicon substrate Nsub where the p$^+$ diffusion region PD6 is not formed. This region is equivalent to an area lying directly below the N well NW of the device forming portion 2. This n$^+$ diffusion region ND6 becomes a contact region to secure conduction between the N type silicon substrate Nsub and the N well NW.

Accordingly, the power supply potential is applied to the N type silicon substrate Nsub N type silicon substrate Nsub from the power supply terminal (not shown) via the wire W1, the via V1, the n$^+$ diffusion region ND1, the N well NW and the n$^+$ diffusion region ND6. The ground potential is applied to the p$^+$ diffusion region PD6 from the ground terminal (not shown) via the wire W11, the via V11, the p$^+$ diffusion region PD5, the P well PW and the P type epitaxial layer PEpi1. As a result, a capacitor C3 is formed at the interface between the N type silicon substrate Nsub and the p$^+$ diffusion region PD6.

In the embodiment, the capacitor C3 functions as a decoupling capacitor connected to the power supply. The area of the capacitor C3 can be controlled to adjust the capacitance of the capacitor C3 by controlling the area of the p$^+$ diffusion region PD6. As the power supply potential is applied to the N type silicon substrate Nsub through the wire W1, it is unnecessary to connect the bottom side of the N type silicon substrate Nsub to the power supply terminal, thus making the mounting into a package easier. The other effects of the embodiment are the same as those of the first embodiment.

FIG. 6 is a cross-sectional view showing a semiconductor integrated circuit device 1e according to a fifth embodiment of the invention. As shown in FIG. 6, the embodiment is a combination of the third embodiment and the fourth embodiment. Specifically, as shown in FIG. 6, the N type silicon substrate Nsub is provided in the semiconductor integrated circuit device 1e according to the embodiment. The bottom side of the N type silicon substrate Nsub is not connected to the power supply terminal. The N type epitaxial layer NEpi1 is formed on the N type silicon substrate Nsub. The N type epitaxial layer NEpi1 has a resistivity of, for example, 0.3 Ω·cm. The p$^+$ diffusion region PD6 is selectively formed on the top surface of the N type epitaxial layer NEpi1. The p$^+$ diffusion region PD6 has a resistivity of, for example, 0.01 Ω·cm.

The device forming portion 2 is provided on the N type epitaxial layer NEpi1. The structure of the device forming portion 2 is the same as the structure of the above-described first embodiment. Further, the n$^+$ diffusion region ND6 is formed in the same layer as the P type epitaxial layer PEpi1 in the area of the top surface of the N type epitaxial layer NEpi1 where the p$^+$ diffusion region PD6 is not formed and which is equivalent to an area lying directly below the N well NW of the device forming portion 2. This n$^+$ diffusion region ND6 becomes a contact region to secure conduction between the N type epitaxial layer NEpi1 and the N well NW.

The power supply potential is applied to the N type epitaxial layer NEpi1 via the wire W1, the via V1, the n$^+$ diffusion region ND1, the N well NW and the n$^+$ diffusion region ND6 shown in FIG. 1. The ground potential is applied to the p$^+$ diffusion region PD6 via: the wire W11, the via V11, the p$^+$ diffusion region PD5, the P well PW and the P type epitaxial layer PEpi1. As a result, a capacitor C4 is formed at the interface between the N type epitaxial layer NEpi1 and the p$^+$ diffusion region PD6.

In the embodiment, the capacitor C4 functions as a decoupling capacitor with respect to the power supply. As the impurity concentration of the N type epitaxial layer NEpi1 is higher than the impurity concentration of the N type silicon substrate Nsub, the capacitance of the capacitor C4 becomes larger than the capacitance of the capacitor C3 in the third embodiment. As the power supply potential is applied to the N type epitaxial layer NEpi1 through the wire W1, the bottom side of the N type silicon substrate Nsub need not be connected to the power supply terminal.

Further, as the current need not flow in the N type silicon substrate Nsub in the embodiment, the N type silicon substrate Nsub can be replaced with an arbitrary substrate. For example, using a high-resistance substrate having a resistivity of, for example, 100 Ω·cm or higher as the substrate can suppress the flow of noise current in the substrate. The other effects of the embodiment are the same as those of the first embodiment.

Figure 7:
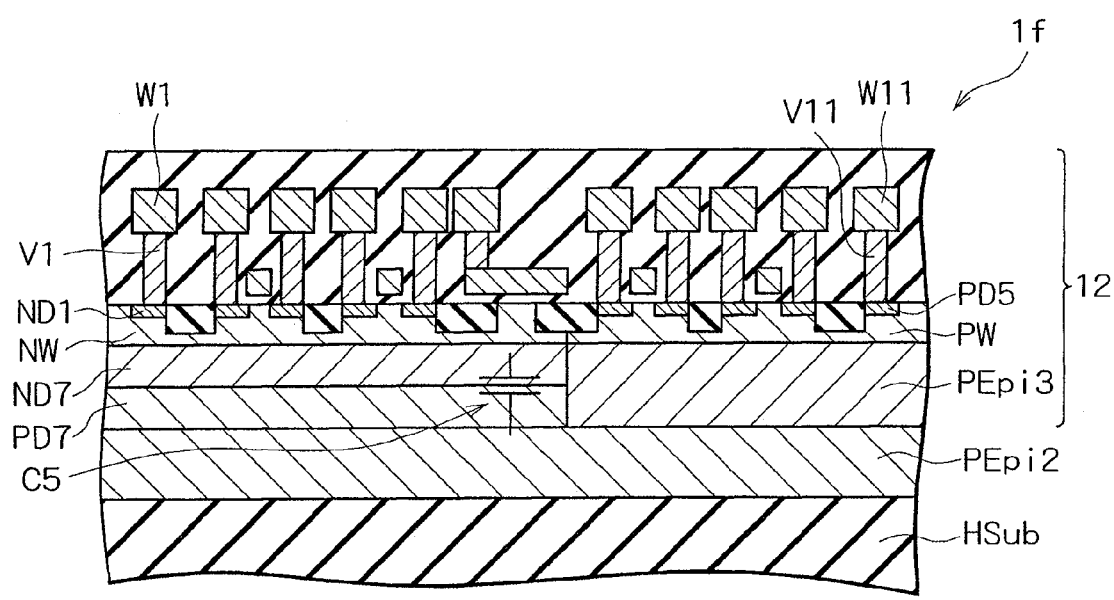
FIG. 7 is a cross-sectional view showing a semiconductor integrated circuit device according to a sixth embodiment of the invention.

FIG. 7 is a cross-sectional view showing a semiconductor integrated circuit device 1f according to a sixth embodiment of the invention. As shown in FIG. 7, a high-resistance substrate Hsub is provided in the semiconductor integrated circuit device 1f according to the embodiment. The high-resistance substrate Hsub has a resistivity of, for example, 100 Ω·cm or higher. The P type epitaxial layer PEpi2 is formed on the high-resistance substrate Hsub. The P type epitaxial layer PEpi2 has a resistivity of, for example, 0.3 Ω·cm. A device forming portion 12 is provided on the P type epitaxial layer PEpi2.

In the device forming portion 12, a P type epitaxial layer PEpi3 is provided selectively on the P type epitaxial layer PEpi2. The P type epitaxial layer PEpi3 has a resistivity of, for example, 10 Ω·cm and has a thickness of, for example, 1 to 5 μm. A $p^+$ diffusion region PD7 is provided selectively in that region where the P type epitaxial layer PEpi3 is not provided, and an $n^+$ diffusion region ND7 is provided on the $p^+$ diffusion region PD7. The $p^+$ diffusion region PD7 has a resistivity of, for example, 1 Ω·cm and the $n^+$ diffusion region ND7 has a resistivity of, for example, 1 Ω·cm. The total thickness of the $p^+$ diffusion region PD7 and the $n^+$ diffusion region ND7 is equal to the thickness of the P type epitaxial layer PEpi3. The double-layer film comprised of the $p^+$ diffusion region PD7 and the $n^+$ diffusion region ND7 is formed in the same layer as the P type epitaxial layer PEpi3. The P well PW is provided on the P type epitaxial layer PEpi3, and the N well NW is provided on the $n^+$ diffusion region ND7. The other structure of the device forming portion 12 is the same as the corresponding structure of the device forming portion 2 (see FIG. 1) in the first embodiment.

In the semiconductor integrated circuit device 1f, the power supply potential is applied to the $n^+$ diffusion region ND7 via the: wire W1, via V1, $n^+$ diffusion region ND1, and N well NW. The ground potential is applied to the $p^+$ diffusion region PD7 via the: wire W11, via V11, $p^+$ diffusion region PD5, P well PW, P type epitaxial layer PEpi3 and P type epitaxial layer PEpi2. This forms a capacitor C5 at the interface between the $p^+$ diffusion region PD7 and the $n^+$ diffusion region ND7.

In the embodiment, the capacitor C5 functions as a decoupling capacitor connected in parallel to the power supply. Using the high-resistance substrate having a resistivity of 100 Ω·cm or higher as the substrate can suppress the flow of noise current in the substrate. In the embodiment, the decoupling capacitor can selectively be formed directly below the N well NW. Therefore, an exclusive capacitor can be laid out near a circuit region where power supply noise is likely to occur and a circuit region which is susceptible to power supply noise. This can effectively suppress the adverse influence of power supply noise on the circuit, and thereby improve the implementability of the noise suppressing effect. The other effects of the embodiment are the same as those of the first embodiment.

Although an example where the capacitor C5 is formed directly under the N well NW has been illustrated in the foregoing description of the sixth embodiment, the invention is not limited to this particular structure, as the capacitor may be formed directly under the P well PW. In this case, an N type layer, e.g., an N type epitaxial layer, should be provided on the high-resistance substrate Hsub, and an $n^+$ diffusion region and a $p^+$ diffusion region should be formed in order on the N type layer in such a way that the $p^+$ diffusion region would be connected to the P well.

What is claimed is:

1. A semiconductor integrated circuit device comprising:
   a first conductivity type semiconductor substrate;
   a first conductivity type semiconductor layer provided on said first conductivity semiconductor substrate, said first conductivity type semiconductor layer being coupled to a first power supply;
   a device forming portion provided on an upper surface of said first conductivity type semiconductor layer and including a second conductivity type well connected to a second power supply, and a first conductivity type well, wherein the entirety of said device forming portion is provided on the upper surface of said first conductivity type semiconductor layer, said device forming portion having a bottom surface contacting with said upper surface of said first conductivity type semiconductor layer, said upper surface of said first conductivity type semiconductor layer being substantially flat, and wherein a first device is formed within a region of the device forming ortion including the first conductivity type well and a second device is formed within a region of the device forming portion including the second conductivity type well; and
   a decoupling capacitor formed at an interface between said first conductivity type semiconductor layer and said second conductivity type well.

2. The semiconductor integrated circuit device according to claim 1, wherein said first conductivity type semiconductor layer is connected to said first power supply via said first conductivity type semiconductor substrate.

3. The semiconductor integrated circuit device according to claim 1, wherein said device forming portion has an active element connected to third and fourth power supplies, and a potential of said third power supply differs from potentials of said first and second power supplies.

4. The semiconductor integrated circuit device according to claim 1, wherein said first conductivity type semiconductor layer is provided on an entire top surface of said first conductivity type semiconductor substrate.

5. The semiconductor integrated circuit device according to claim 1, wherein said first conductivity type semiconductor layer is connected to said first power supply via said first conductivity type well.

* * * * *

UNITED STATES PATENT AND TRADEMARK OFFICE
CERTIFICATE OF CORRECTION

| | | |
|---|---|---|
| PATENT NO. | : 7,973,383 B2 | Page 1 of 1 |
| APPLICATION NO. | : 11/860050 | |
| DATED | : July 5, 2011 | |
| INVENTOR(S) | : Furumiya et al. | |

It is certified that error appears in the above-identified patent and that said Letters Patent is hereby corrected as shown below:

Claim 1, Col. 12, line 31 "forming ortion including" should be --forming portion including--.

Signed and Sealed this
Twenty-third Day of October, 2012

David J. Kappos
*Director of the United States Patent and Trademark Office*